US006859203B2

(12) United States Patent
van Muiswinkel et al.

(10) Patent No.: US 6,859,203 B2
(45) Date of Patent: Feb. 22, 2005

(54) SWEEPING REAL-TIME SINGLE POINT FIBER

(75) Inventors: Arianne M. C. van Muiswinkel, Best (NL); Ronaldus F. J. Holthuizen, Son en Breugel (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 212 days.

(21) Appl. No.: 10/145,917

(22) Filed: May 15, 2002

(65) Prior Publication Data

US 2003/0216634 A1 Nov. 20, 2003

(51) Int. Cl.$^7$ .............................................. G06T 17/00
(52) U.S. Cl. ...................................................... 345/424
(58) Field of Search .............................. 345/419, 420, 345/424, 426, 427, 428; 324/307, 309, 312; 600/419

(56) References Cited

U.S. PATENT DOCUMENTS

| | | | | |
|---|---|---|---|---|
| 5,488,297 | A | | 1/1996 | Nakada ..................... 324/309 |
| 5,539,310 | A | | 7/1996 | Basser et al. ............... 324/307 |
| 6,057,686 | A | * | 5/2000 | Van Den Brink et al. .. 324/309 |
| 6,076,006 | A | * | 6/2000 | Van Den Brink et al. .. 600/419 |
| 6,172,502 | B1 | * | 1/2001 | Groen et al. ............... 324/307 |
| 6,331,777 | B1 | * | 12/2001 | Van Den Brink et al. .. 324/312 |
| 6,377,045 | B1 | * | 4/2002 | Van Den Brink et al. .. 324/307 |
| 6,518,760 | B2 | * | 2/2003 | Fuderer et al. ............. 324/307 |
| 6,584,338 | B1 | * | 6/2003 | Van Muiswinkel ......... 600/419 |

FOREIGN PATENT DOCUMENTS

| | | |
|---|---|---|
| JP | 11000320 | 6/1999 |
| WO | WO 01/91639 A1 | 12/2001 |
| WO | WO 01/91639 | 12/2001 |

OTHER PUBLICATIONS

Peled, S., et al.; Superresolution in MRI: Application to Human White Matter Fiber Tract Visualization by Diffusion Tensor Imaging, Magnetic Resonance in Medicine, Jan. 2001; pp 29–35, Academic Press, Duluth, MN.
Tournier, J., et al.; Limitations and requirements of diffusion tensor fiber tracking: an assessment using simulations; Magnetic Resonance in Medicine, Apr. 2002; pp 701–708; Wilev.
Mori, et al., "Imaging Cortical Association Tracts in the Human Brain Using Diffusion–Tensor–Based Axonal Tracking", Magnetic Resonance in Medicine 47:215–233 (2002).
Courant, et al. "Methods of Mathematical Physics", Interscience Publishers New York, vol. 1, ©1937, pp. 458–459.

* cited by examiner

*Primary Examiner*—Almis R. Jankus
(74) *Attorney, Agent, or Firm*—Fay, Sharpe, Fagan, Minnich & McKee LLP

(57) ABSTRACT

An imaging method for imaging a subject (18) including fibrous/anisotropic structures (102) includes acquiring three-dimensional image representations without and with a plurality of different diffusion weighting and directions. When a user (56) hovers a selection device over a voxel of the image, a fiber representation (54) is extracted in substantially real time. The representation is generated by following a direction of a major eigenvector $e_1$ from voxel to voxel. A human-viewable display of the fiber representation is produced (210).

23 Claims, 5 Drawing Sheets

SWEEPING REAL-TIME SINGLE POINT FIBER

BACKGROUND OF THE INVENTION

The present invention relates to medical imaging arts. In particular, it relates to the imaging, tracking, and displaying of neural fibers and fiber bundles by diffusion tensor magnetic resonance imaging (DT-MRI), and will be described with particular reference thereto. However, the invention will also find application in conjunction with tracking and graphical rendering of other types of fibrous structures, as well as with other imaging modalities.

Nerve tissue in human beings and other mammals includes neurons with elongated axonal portions arranged to form neural fibers or fiber bundles along which electrochemical signals are transmitted. In the brain, for example, functional areas defined by very high neural densities are typically linked by structurally complex neural networks of axonal fiber bundles. The axonal fiber bundles and other fibrous material are substantially surrounded by other tissue.

Diagnosis of neural diseases, planning for brain surgery, and other neurologically related clinical activities, as well as research studies on brain function, can benefit from non-invasive imaging and tracking of the axonal fibers and fiber bundles. In particular, diffusion tensor magnetic resonance imaging (DT-MRI) has been shown to provide sufficient image contrast to image axonal fiber bundles. In the DT-MRI technique, diffusion-sensitizing magnetic field gradients are applied in the excitation/imaging sequence so that the magnetic resonance images include contrast related to the diffusion of water or other fluid molecules. By applying the diffusion gradients in selected directions during the excitation/imaging sequence, diffusion weighted images are acquired from which apparent diffusion tensor coefficients are obtained for each voxel location in image space.

Fluid molecules diffuse more readily along the direction of the axonal fiber bundle as compared with directions partially or totally orthogonal to the fibers. Hence, the directionality and anisotropy of the apparent diffusion coefficients tend to correlate with the direction of the axonal fibers and fiber bundles.

The fiber structures are typically not easily discernable in conventional MRI images. Extraction of fibrous structure information from DT-MRI images is computationally intensive. Processing times to reconstructing images of fibers passing through a selected region are typically from several tens of minutes to an hour or more for clinically valuable images. If the selected region misses the fiber bundle of interest, completely or even partially, the selected region is shifted and the processing is started again. To avoid wasting valuable time, it would be beneficial for a clinician to know whether or not the selected data is capable of yielding useful diagnostic images. In cases where the data is not useful, reconstruction times are wasted.

The present invention contemplates an improved apparatus and method which overcomes the aforementioned limitations and others.

SUMMARY OF THE INVENTION

According to one aspect of the present invention, a method of diffusion imaging is provided. Static and diffusion weighted images are gathered, and one of them displayed on a human viewable display. A starting voxel is selected in the display. A maximum diffusion eigenvalue with its direction is determined for the starting voxel, and a neighboring voxel identified. A maximum diffusion eigenvalue with its direction is determined for the neighboring voxel. A track of neighboring voxels along the diffusion directions are identified and converted into a human readable format substantially in real time.

According to another aspect of the present invention, a method of magnetic resonance is provided. A plurality of image representations with and without diffusion weighting are acquired. One of the image representations is converted into a human readable display. A voxel of the displayed image is selected as a starting point. A fiber path is calculated of a fiber that intersects the start point, and an image of that path is overlaid on the human readable display.

According to another aspect of the present invention, a magnetic resonance apparatus is provided. A acquiring means acquires a plurality of image representations. A display means converts the image representations to a human readable image. A selecting means selects one of a voxel and a group of voxels as a starting point. A calculating means calculates a diffusion path along a fiber bundle that intersects the starting point. An overlaying means overlays a representation of the fiber on the human readable image.

According to yet another aspect of the present invention, a method of displaying a diffusion pathway is provided. An MR image of a region containing fibrous structures is gathered. A starting point is selected. Eigenvector are calculated along a route of the fibrous structure. A combined image containing the imaged anatomy and a representation of the fibrous structure is formed and displayed.

One advantage of the present invention resides in substantially real time structure realization.

Another advantage of the present invention resides in improved computational speed.

Yet another advantage of the present invention resides in more meaningful images.

Numerous additional advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

DETAILED DESCRIPTION OF THE PREFERRED EMBODIMENTS

Figure 1:
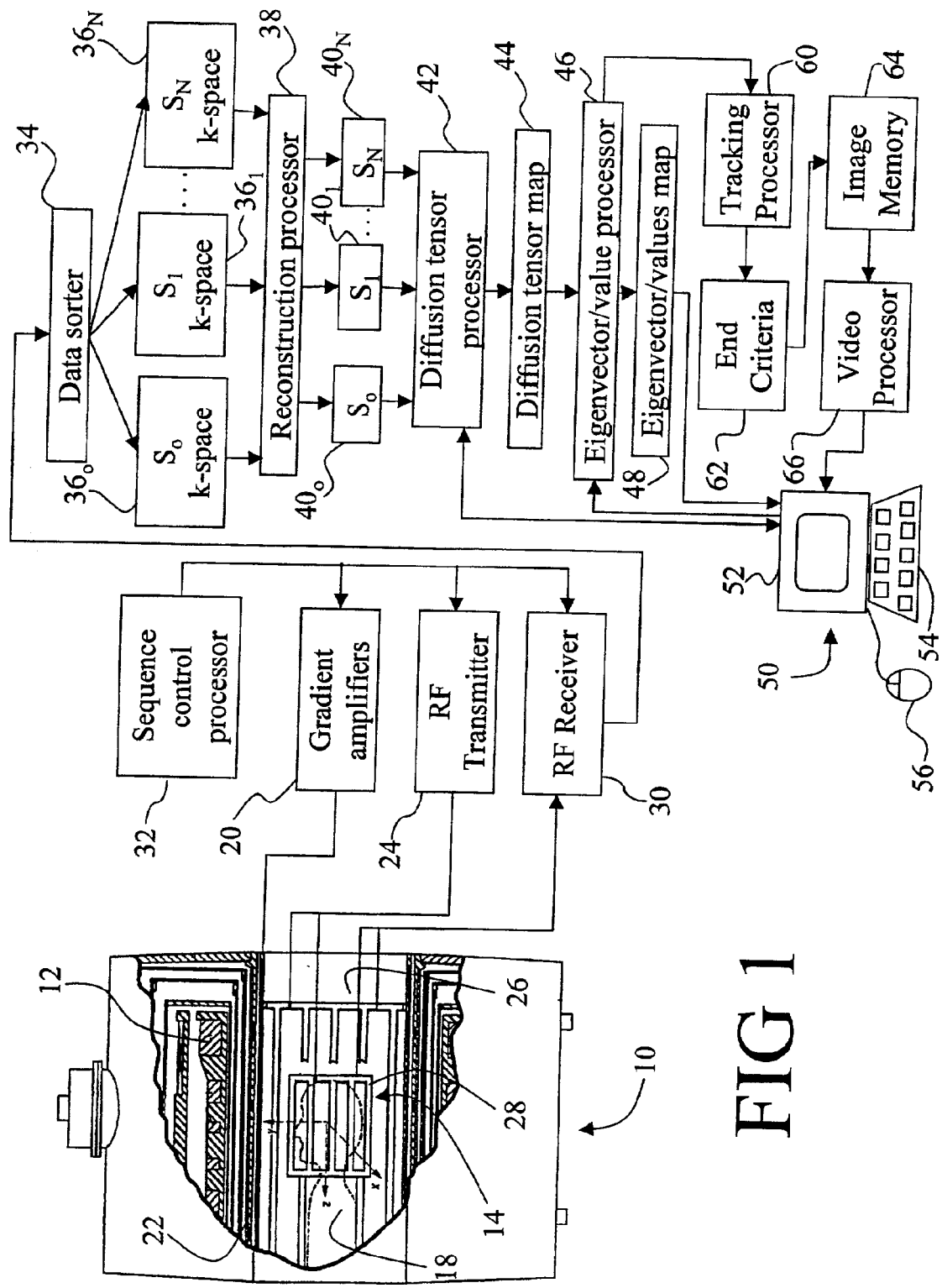
FIG. 1 is a diagrammatic illustration of an exemplary magnetic resonance imaging (MRI) technique in accordance with the present invention.

With reference to FIG. 1, a magnetic resonance imaging (MRI) scanner 10 typically includes superconducting or resistive magnets 12 that create a substantially uniform, temporally constant main magnetic field $B_0$ along a z-axis through an examination region 14. Although a bore-type magnet is illustrated in FIG. 1, the present invention is also applicable to open magnet systems and other types of MRI scanners. Imaging is conducted by executing a magnetic resonance excitation and readout sequence with the subject being imaged, e.g. a patient 18, placed at least partially within the examination region 14, typically with the region of interest at an isocenter of the magnet 12. For diffusion tensor MRI imaging of the brain region, the patient's head is preferably placed at the isocenter.

The magnetic resonance sequence includes a series of RF and magnetic field gradient pulses that are applied to the subject 16 to manipulate and detect magnetic resonance. More specifically, gradient pulse amplifiers 20 apply current pulses to a whole body gradient coil assembly 22 to create magnetic field gradients along x, y, and z-axes of the examination region 14. In diffusion-weighted MRI, selected motion sensitizing magnetic field gradients are applied to detect diffusion of body fluid molecules moving in selected directions.

An RF transmitter 24, preferably digital, applies RF pulses or pulse packets to a whole-body RF coil 26 to transmit RF pulses into the examination region. The RF pulses are used to saturate, excite resonance, invert magnetization, refocus resonance, or manipulate resonance in selected portions of the examination region.

For whole-body applications, the resulting resonance signals, generated as a result of a selected manipulation, are received by the whole-body RF coil 26. Alternately, for generating RF pulses in limited regions of the subject, local RF coils are placed contiguous to the selected region for transmission and/or reception. For brain imaging, an insertable local head coil 28 is preferably employed.

Regardless of the RF coil configuration and the application, the resultant RF magnetic resonance signals are received and demodulated by an RF receiver 30, preferably a digital receiver. A sequence control processor 32 controls the gradient pulse amplifiers 20, the RF transmitter 24, and the RF receiver 30 to produce integrated MRI pulse sequence and readout waveforms that generate the magnetic resonance signals and optional echoes, provide appropriate encoding gradients to spatially and diffusion encode the resultant MR response, and coordinate MR pickup and receive operations.

The MRI sequence typically includes a complex series of magnetic field gradient pulses and/or sweeps transmitted by the gradient coil 22 which along with selected RF pulses transmitted by RF coils 26 result in a train of magnetic resonance echoes. Some of the echoes have no motion sensitization. Other echoes of each train are motion sensitized with motion sensitization gradients in N diffusion weighting directions, indexed 1 ... N. Preferably, $N \geq 6$. The resultant magnetic resonance data is sorted by a sorter 34 and stored in k-space memories 36. The static and diffusion weighted data sets are acquired and sorted into corresponding k-space memories $36_0$, $36_1$, ... $36_N$. The k-space data sets $36_0$, $36_1$, ... $36_N$ are processed by a reconstruction processor 38, which is typically an inverse Fourier transform processor or other reconstruction processor known to the art, to produce reconstructed image representations $40_0$, $40_1$, ... $40_N$. A static, image $S_0$ $40_0$ is reconstructed without diffusion weighting and N motion sensitized images are reconstructed with each of N diffusion weighting.

For DT-MRI, apparent diffusion coefficients (ADC's) with selected directions are obtained by linear regression of images with different diffusion weighting. The ADC for selected directions (i,j) are determined by acquiring a diffusion-weighted image $S_{i,j}$ diffusion weighted in the (i,j) direction which relates to the static image $S_0$ $40_0$ according to:

$$S_{i,j} = S_0 e^{-B \cdot ADC_{i,j}} \qquad (1),$$

where B is a magnetic field parameter and $ADC_{i,j}$ is the apparent diffusion coefficient for the (i,j) direction. The ADC is calculated from equation (1) as:

$$ADC_{i,j} = -\frac{1}{B}\ln\left(\frac{S_{i,j}}{S_o}\right). \qquad (2)$$

Beneficially, image contrast resulting from mechanisms other than the diffusion weighting, such as $T_1$, $T_2$, $T_{2*}$, and like image contrast mechanisms, are substantially removed by the image linear regression. A diffusion tensor processor 42 calculates a plurality of ADC values on a per voxel basis according to equation (2) to construct a diffusion tensor map 44. Six diffusion directions typically provide sufficient information to construct the diffusion tensor at each voxel.

Figure 2:
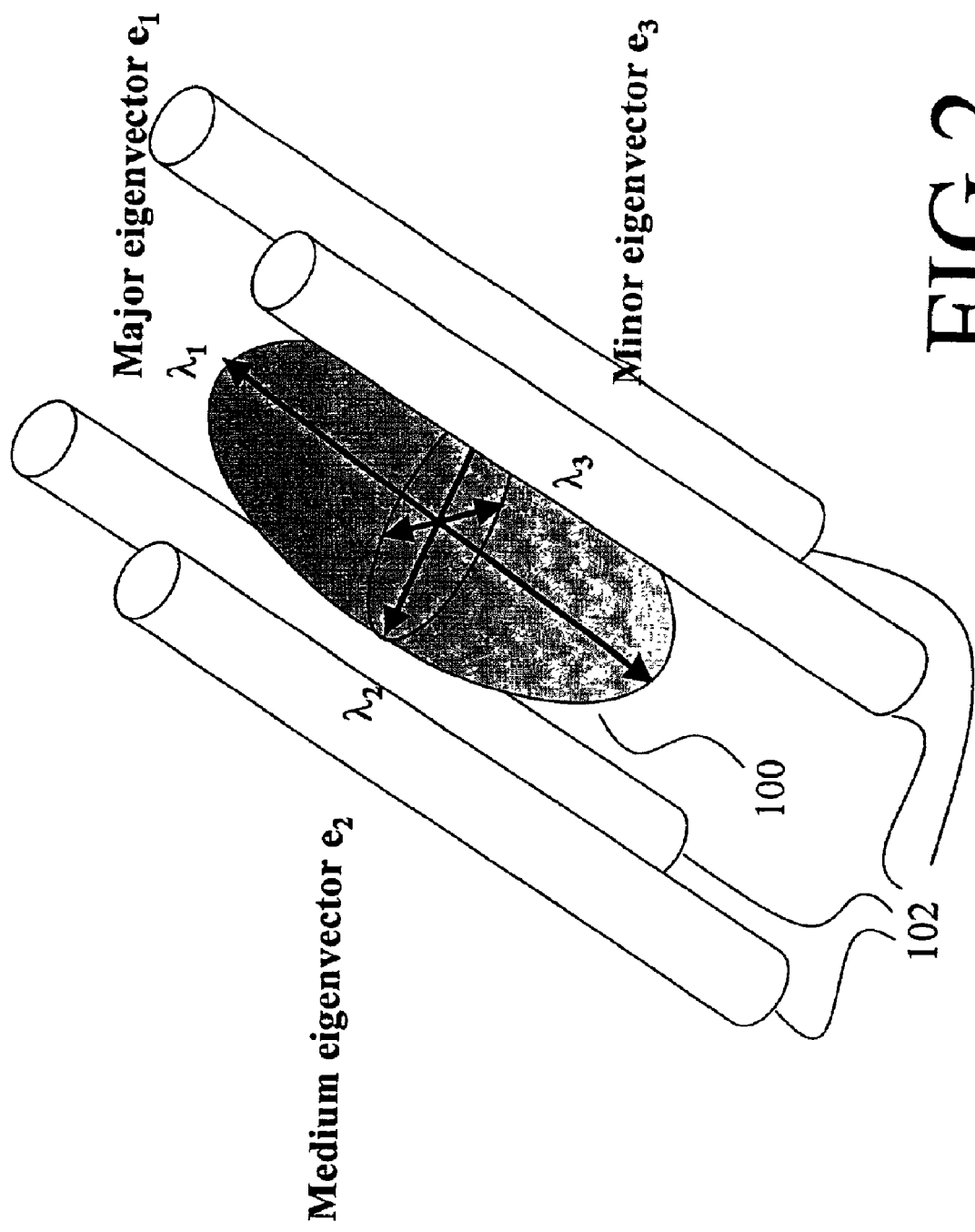
FIG. 2 is a perspective representation of eigenvectors and eigenvalues of a diffusion coefficient tensor and their relationship with axonal fibers or fiber bundles.

With continuing reference to FIG. 1 and with further reference to FIG. 2, an eigenvector/eigenvalue processor 46 obtains at each voxel the diffusion tensor eigenvectors and eigenvalues to construct an eigenvector/eigenvalue map 48.

In a preferred embodiment, the eigenvalue processor 46 diagonalizes the diffusion tensor using Jacobi's method of multiplicative variation or another mathematical technique to obtain the eigenvectors and eigenvalues. As seen in FIG. 2, the eigenvalues $\lambda_1$, $\lambda_2$, $\lambda_3$ and the corresponding eigenvectors $e_1$, $e_2$, $e_3$ of the diffusion tensor have useful physical significance. The largest eigenvalue is designated in FIG. 2 as $\lambda_1$. The corresponding eigenvector $e_1$ is called the major eigenvector, and aligns with the spatial direction having the highest diffusion coefficient. The remaining eigenvalues $\lambda_2$, $\lambda_3$ have corresponding eigenvectors $e_2$, $e_3$ called the medium and minor eigenvectors. These eigenvectors $e_2$, $e_3$ are orthogonal to $e_1$ and to each other and align with spatial directions having lower diffusion coefficients. The relative values of the eigenvalues $\lambda_1$, $\lambda_2$, $\lambda_3$ are indicative of the spatial orientation and magnitude of the diffusion tensor anisotropy.

To preview this process, the operator selects a starting voxel for a starting point. In a suitable selection process, the user operates an interface device 50 such as a personal computer or workstation including a graphical display 52, a keyboard 54, a mouse or other pointing device 56, and/or similar input or output elements. The display 52 shows an image representation of the subject 18, for example a slice or other two-dimensional surface through one of the images, such as the static image $40_0$. Preferably, the display is divided into quadrants. A 3D rendering is shown in one quadrant and three orthogonal slices which intersect at a common point are displayed in the other three quadrants. The display also includes a superimposed interactive cursor or other graphical selection tool known to the art which is operable by the user through the pointing device 56, the keyboard 54, or other input device. Preferably, the cursor marks the common intersection point and is displayed in all four quadrants. Clicking the mouse or the like can be used to select the voxel denoted by the cursor.

The eigenvectors and eigenvalues for the selected starting point are calculated. A tracking or projection processor 60 determines that direction of the largest eigenvector and identifies the next voxel in that direction. An end criteria processor 62 determines if any of pre-selected end or branching criteria are met. If not, the process is repeated for the identified next voxel. The calculated eigenvectors and eigenvalues are also stored in the map 48. Preferably, the previewing process is also performed in the negative eigenvector direction of the start point, i.e. the fiber is grown in both directions from the starting point. The voxels for which eigenvectors are calculated in this process form a filament track which is stored in a temporary image memory 64.

Figure 3:
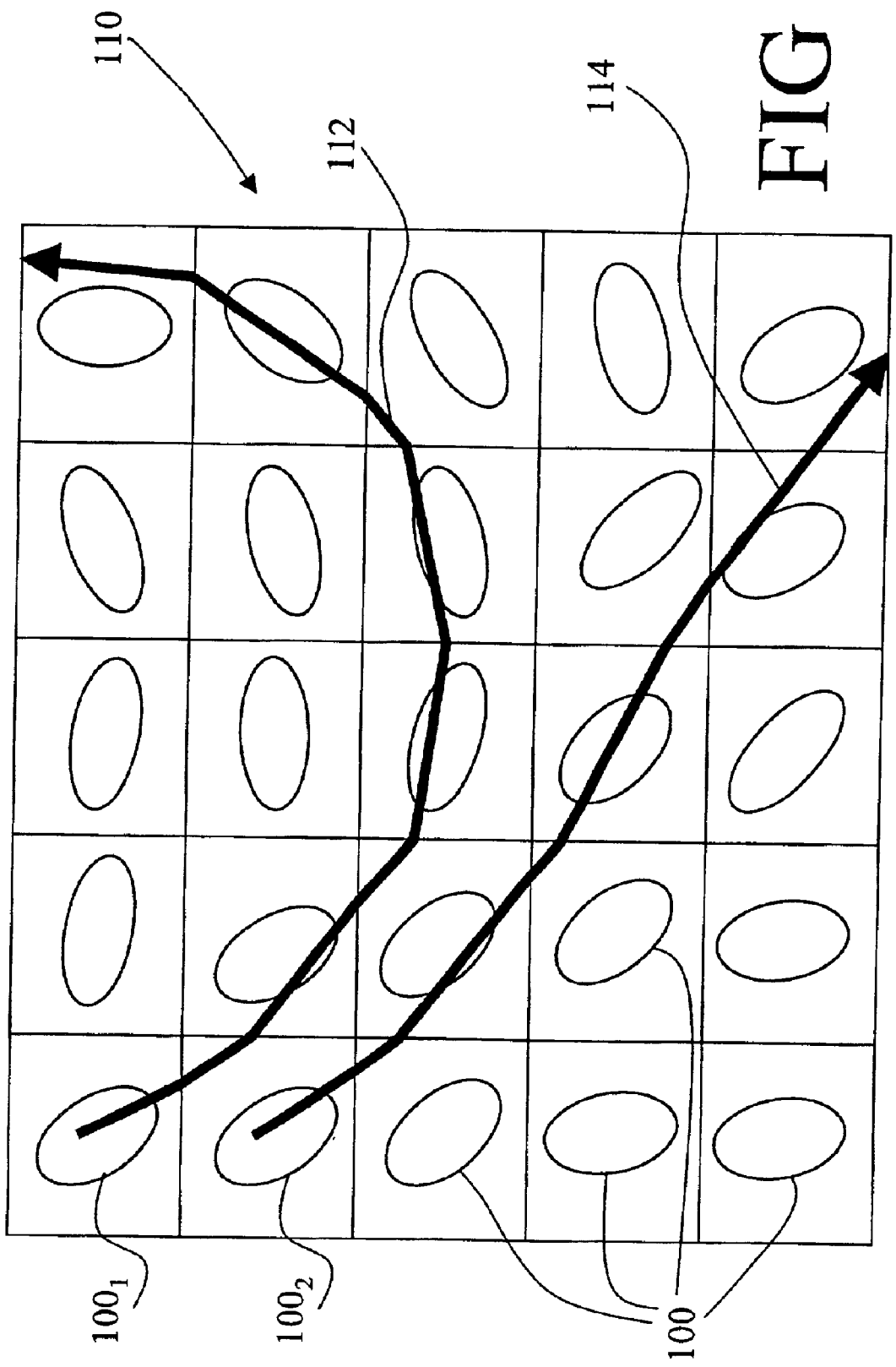
FIG. 3 is a two-dimensional representation of the fiber tracking.

With continuing reference to FIGS. 1, and 2, and with further reference to FIG. 3, the tracking processor 60 iteratively tracks a fiber using a tracking direction given by the major eigenvector $e_1$ of the diffusion tensor of the seed voxel and each subsequent voxel. FIG. 3 shows a first fiber representation track 112 which starts at a starting point 100₁, and a second fiber representation track 114 which starts at a starting point 100₂.

Although unidirectional tracking is shown in FIG. 3, it will be appreciated that tracking can optionally occur bi-directionally, i.e. extending in both the $e_1$ and the $-e_1$ directions, to provide more complete fiber tracking. Furthermore, although an exemplary two-dimensional array of voxels is shown in FIG. 3, it will be appreciated that the tracking will generally occur three-dimensionally. A video processor 66 highlights the track of voxels from the temporary memory and superimposes the highlighted voxels on a human readable image displayed on the monitor 52. Additionally, a limited visualization technique is preferably utilized, e.g. a polyline technique, to minimize processor usage and expedite visualization of the fiber. Calculating only the eigenvectors of only one fiber thread or a small bundle of threads saves the extended processing of the entire eigenvector map.

By moving the cursor from voxel to voxel, the user can quickly visualize the ends and routes of fibers of potential interest. The user uses this information to a subregion of voxels which correspond to the fiber bundle of interest. With this information, a limited subset of voxels can be selected for diffusion imaging.

With continuing reference to FIG. 2, the eigenvectors and eigenvalues are geometrically representable by an ellipsoid 100 whose long axis aligns with eigenvector $e_1$, i.e. with the direction with the highest diffusion coefficient. The deviation of the ellipsoid 100 from a perfect sphere is representative of the anisotropy of the diffusion tensor, that is, a voxel having a spherical representation exhibits equal diffusion in all directions. An anisotropic diffusion coefficient tensor can reflect the influence of neural fiber bundles 102 which tend to inhibit diffusion in directions partially or totally orthogonal to the fibers 102, e.g. the directions of eigenvectors $e_2$, $e_3$. In contrast, diffusion parallel to the fibers 102, i.e. along the direction of the major eigenvector $e_1$, is larger than along the $e_2$, $e_3$ directions.

With returning reference to FIG. 1, e.g. an anisotropy map 70 such as a fractional anisotropy map known to the art, or other anisotropy image map that emphasizes the anisotropy magnitude, is optionally calculated from the eigenvectors/ eigenvalues map 48. In a suitable embodiment, the fractional anisotropy is calculated on a per voxel basis according to:

$$FA = \begin{cases} \sqrt{\dfrac{3\sum_{i=1,2,3}(\lambda_i-\lambda_{avg})^2}{2\sum_{i=1,2,3}\lambda_i^2}}, & \sqrt{\dfrac{1}{3}(\lambda_1^2+\lambda_2^2+\lambda_3^2)} \geq 0.10 \\ 0.10, & \sqrt{\dfrac{1}{3}(\lambda_1^2+\lambda_2^2+\lambda_3^2)} < 0.10, \end{cases} \quad (3)$$

where $$\lambda_{avg} = \frac{\lambda_1+\lambda_2+\lambda_3}{3}. \quad (4)$$

The anisotropy map of equations (3) and (4) has been found to be particularly suitable for use in selecting fibrous regions for diffusion fiber tracking. As is known to those skilled in the art, the anisotropy map 70 provides a convenient image representation of the anisotropy magnitude.

Preferably, the processor 66 produces a 3D rendering which can be rotated, resized, or otherwise manipulated by the user via the mouse, keyboard, or other input device.

Figure 4:
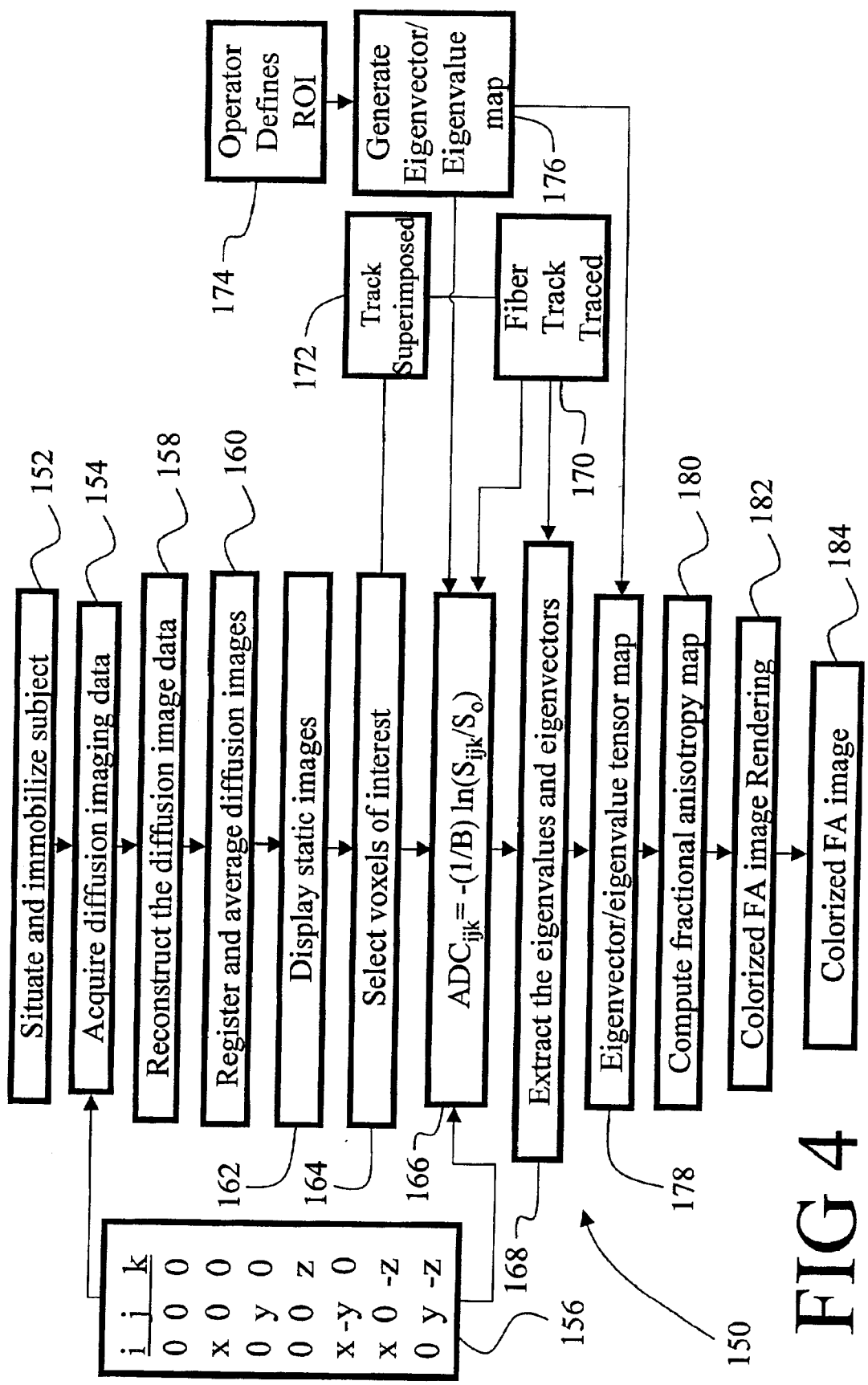
FIG. 4 is a flowchart outlining an exemplary process for acquiring diffusion tensor magnetic resonance imaging data and for computing an apparent diffusion coefficient tensor map, an eigenvalue/eigenvector map, and a fractional anisotropy map therefrom.

With reference to FIG. 4, a subject is situated and immobilized within the magnetic resonance imaging (MRI) scanner in a step 152. As DT-MRI imaging includes acquisition of a large number of images over a substantial period of time, the subject is preferably immobilized to minimize motion blurring and motion-induced image distortion.

The DT-MRI imaging data is acquired in a step 154 using imaging sequences such as spin-echo sequences which includes additional magnetic field gradient pulses that produce the selected diffusion weighting. Preferably, a multiple-echo sequence is used in which images are acquired with several diffusion weighting 156 corresponding to selected apparent diffusion coefficient (ADC) components of the diffusion coefficient tensor. Six apparent diffusion coefficients are generally sufficient to describe the tensor. In the illustrated embodiment, six diffusion weighting 156 are collected, with magnetic field gradient pulses applied in the (x, 0, 0), (0, y, 0), (0, 0, z), (x, −y, 0), (x, 0, −z), and (0, y, −z) directions, along with an unweighted image (0, 0, 0). However, other combinations of diffusion weighting can be used instead. Using a multiple-echo sequence advantageously reduces data acquisition time and minimizes motion-induced blurring or misregistration across images. To improve the signal-to-noise ratio, data for a plurality of images are preferably collected for each diffusion weighting. The imaging sequence also optionally includes additional RF pulses or magnetic field gradient pulses or sweeps to compensate for magnetic field gradient-induced eddy currents and other imaging artifacts.

Image data collected in the step 154 is reconstructed in a step 158 to form static and diffusion weighted image reconstructions $S_0$ and $S_{ijk}$ where ijk indicates the various diffusion weighting 156. The inverse Fourier transform reconstruction known to the art is suitably used, although other reconstruction methods can also be employed.

In spite of precautions such as subject immobilization 152, the DT-MRI images nonetheless typically include subject motion-related misregistration across images. Hence, in a step 160 an image registration is performed to relatively register and align spatially corresponding images. Optionally, any images which deviate significantly from the average with respect to alignment or image features are discarded. Such discarding can be done without loss of critical information when several redundant images are acquired and averaged, and discarding deviating images typically improves the averaged image signal-to-noise ratio.

The operator displays static images 162 and using the cursor, selects 164 voxels of interest. For each selected voxel, the apparent diffusion coefficients (ADC's) are calculated according to equation (2), in a step 166. The eigenvalues and eigenvectors are extracted in a step 168. In a preferred embodiment, the step 164 diagonalizes the voxel diffusion tensors to extract the eigenvectors and eigenvalues map. The track through the selected voxel is traced in a step 170 by finding the direction of the largest, determining the voxel toward which it is pointing, and finding the eigenvectors/eigenvectors for that voxel. The track is colorized and superimposed 172 on the displayed static image.

After viewing a number of fiber tracks, the operator defines a region of interest at a step 174. In an eigenvector/eigenvalue map generating step 176, the eigenvectors/eigenvalues are calculated for each voxel in the defined region of interest and loaded into an eigenvector/eigenvalue tensor map 178.

Optionally, a fractional anisotropy (FA) map is computed in a step 180 in accordance with equations (3) and (4). The FA map is preferably rendered in a step 182, for example by colorizing the voxels based on the FA value, to obtain a colorized FA image 184 for display to an associated user. Various techniques for identifying the region of interest in step 174 are contemplated. For example, the operator can select a plane through which the fiber bundle passes. The fiber bundle is identified in the plane from the voxel fractional anisotropy map. Based on the fractional anisotropy, the bundle is grown from plane to plane until an end of the bundle is reached.

Figure 5:
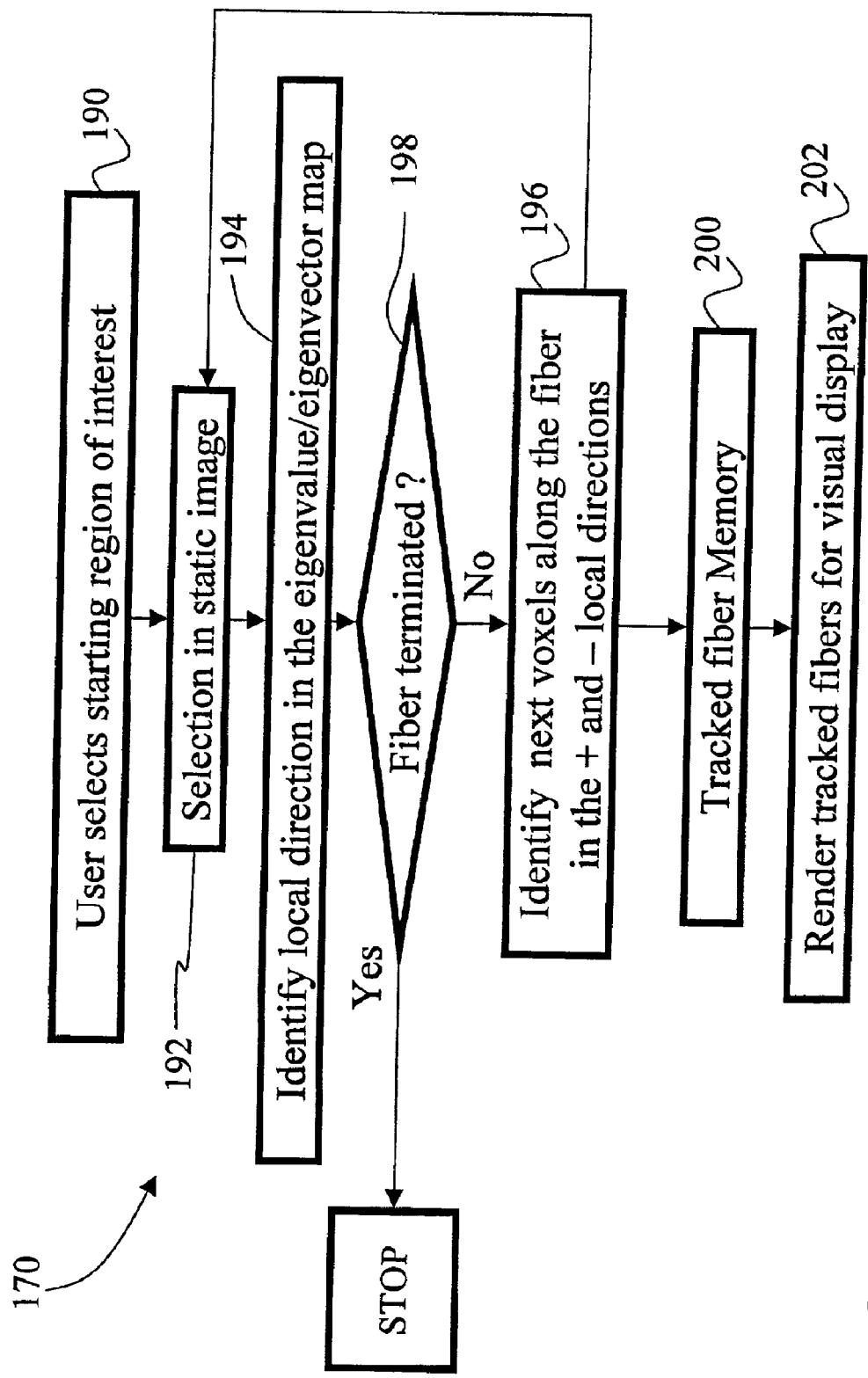
FIG. 5 is a flowchart illustrating the detection and rendering of the fiber bundle.

With reference to FIG. 5, in the step 170, the user selects 190 a starting region of interest. In a preferred embodiment, the selection 192 is made with reference to the static image. The selection is preferably indicated by the user graphically using a mouse pointer or other graphical selection device. The selected region of interest is preferably a single voxel, a group of voxels sharing a common plane, or a three-dimensional region of voxels.

The eigenvectors and eigenvalues of the selected starting voxel are calculated in a step 192. A local direction is identified in a step 194 corresponding to the major eigenvector $e_1$ direction (see FIG. 2). Next voxel(s) are identified in a step 196 which neighbor the current voxel along the local direction (see FIG. 3). In a preferred embodiment, both positive and negative (bi-directional) tracking is performed by identifying next voxels in both positive and negative local $e_1$ directions.

As the tracking progresses bi-directionally, a positive fiber end is grown by successively identifying voxels in the positive local direction while a negative fiber end is grown by successively identifying voxels in the negative local direction. Of course, unidirectional fiber tracking is also contemplated, and may be preferable in certain situations such as tracking a fiber extending away from a large, dense region of deep white matter.

The method of FIG. 5 iteratively repeats the steps 192, 194, and 196, to illuminate the tracked fiber either uni-directionally or bi-directionally. Preferably, a decision step 198 within the iterative loop checks for a termination of a progressing fiber end. One suitable fiber termination criterion includes a fractional anisotropy below a selected value, e.g. at or below the FA=0.10 threshold used in equation (3). This criterion is met when the major eigenvector $e_1$ becomes comparable to the medium eigenvector $e_2$. Since a low fractional anisotropy (FA) corresponds with a highly isotropic diffusion tensor, it is reasonable to assume that a FA value that drops below a selected threshold corresponds to the terminal point of a tracked fiber, that is, that diffusion in the region has essentially ceased.

Another suitable fiber termination criterion is a change in local direction between successive voxels which is greater than a selected angle. A large change in local direction is likely to correspond to a fiber branching point. Optionally, instead of terminating at such an apparent branching point, a new region of interest is defined at or around the branching point and the tracking process 170 is repeated for the new region of interest to track the branching fibers or fiber bundles.

Yet another suitable fiber termination criterion is entrance of the progressing fiber into an ending region of interest selected by the user in the step 190. Various combinations of the exemplary terminating criteria described herein, and/or addition or substitution of other suitable terminating criteria, are also contemplated.

The identified voxels which represent the tracked fiber are stored in a memory 200. The tracked fiber representation is preferably denoted by a distinctive color and graphically displayed in a step 202 for visualization by a human user, e.g. a 3D curvilinear rendering illustrating the path of the fiber. The fiber is advantageously displayed superimposed on the starter image to give the user anatomical landmarks. It is to be understood that other types of rendering can also be employed. The rendering is preferably interactive so that the user can highlight selected fibers, rotate the three-dimensional fiber representation, or otherwise manipulate the data.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of diffusion imaging comprising:
   a) generating an electronic static image representation and a plurality of electronic diffusion weighted image representations;
   b) converting one of the images to a human viewable display;
   c) selecting a single starting voxel on the human readable display;
   d) from the electronic image representations, determining a direction of a maximum diffusion eigenvalue in the starting voxel;
   e) identifying a single neighboring voxel in the determined direction of maximum diffusion;
   f) from the electronic image representations, determining a direction of maximum diffusion in the neighboring voxel;
   g) repeating steps e) and f) to generate a single fiber path through neighboring voxels that represents a single fiber maximum diffusion flow path;
   h) converting the single fiber path to a human viewable display.

2. The method as set forth in claim 1, wherein the single fiber path is generated and converted into a human readable display substantially in real time.

3. The method as set forth in claim 1, wherein the converting step b) includes:
   colorizing the displayed images.

4. The method as set forth in claim 1, wherein the selecting step c) includes:
   hovering a selection cursor over the human readable display to display a series of single fiber paths, one through each selected voxel.

5. The method as set forth in claim 1, wherein the determining the direction of maximum diffusion step includes:
   finding major, medium, and minor eigenvectors of the voxel;
   identifying the major eigenvector.

6. The method as set forth in claim 1, further including:
   in step e) identifying neighboring voxels in both positive and negative directions of a major eigenvector.

7. The method as set forth in claim 1, further including:
   repeating step g) until a termination criterion is met.

8. A method of diffusion imaging comprising:
   a) generating an electronic static image representation and a plurality of electronic diffusion weighted image representations;
   b) converting one of the images to a human viewable display;
   c) selecting a starting voxel on the human readable display;
   d) from the electronic image representations, determining a direction of a maximum diffusion eigenvalue in the starting voxel;
   e) identifying a neighboring voxel in the determined direction of maximum diffusion;
   f) from the electronic image representations, determining a direction of maximum diffusion in the neighboring voxel;
   g) repeating steps e) and f) to generate a track of neighboring voxels;
   h) repeating step g) until at least one of the following termination criteria is met:
      encountering a voxel with a major Eigenvector not greater than a minor or medium Eigenvector of the same voxel by a predetermined threshold;
      encountering a voxel with a major Eigenvector direction different from a previous Eigenvector direction by greater than a predetermined angle;
      exceeding a timeout threshold;
      encountering a voxel without diffusion weighting low a signal intensity threshold; and
   i) converting the track to a human viewable display.

9. The method as set forth in claim 1, wherein the converting step h) includes:
   superimposing the fiber path on the display of step b).

10. The method as set forth in claim 1, wherein the step of determining the direction of maximum diffusion includes:
   determining an apparent diffusion coefficient tensor from the static and diffusion weighted image representations;
   extracting eigenvectors and eigenvalues from the apparent diffusion coefficient tensor.

11. The method as set forth in claim 10, further including:
   from the eigenvectors and eigenvalues, computing an anisotropy value for each voxel.

12. The method as set forth claim 11, wherein the step h) includes:
   rendering an image of the fractional anisotropy of the voxels of the fiber path;
   colorizing the rendered image.

13. A magnetic resonance imaging apparatus comprising:
   a gantry which acquires a plurality of image representations without and with various diffusion weighting and directions;
   a monitor which converts one of the image representations to a human readable display;
   a manual input device through which an operator selects one of a voxel and a group of voxels; and
   an image processor programmed to:
      calculate a path of a fiber center line that intersects each selected one of the selected voxels;
      overlay an image of each fiber center line onto the human readable display on the monitor.

14. A magnetic resonance apparatus comprising:
   a means for acquiring a plurality of image representation without and with each of a plurality of diffusion weighting and directions;
   a display means for converting the image representations to a human readable image;
   a means for selecting at least one voxel as a starting point;
   means for determining a direction of a maximum diffusion eigenvalue in the starting voxel;
   means for identifying a voxel neighboring the starting point in the determined direction of maximum diffusion;
   a means for determining a direction of maximum diffusion in the neighboring voxel;
   a means for calculating a path of fluid diffusing along a fiber that intersects the starting point by causing the neighboring voxel identifying means and the neighboring voxel maximum diffusion direction calculating means to generate a track of neighboring voxels until a least one of the following terminate on criteria is met:
      encountering a voxel with a major Eigenvector not greater than a minor or medium Eigenvector of the same voxel by pre-determined threshold:
      encountering a voxel with a major Eigenvector direction different from a previous Eigenvector direction by greater than a pre-determined angle;
      exceeding a timeout threshold;
      encountering a voxel without diffusion weighting below a signal intensity threshold; and
   a means for overlaying the calculated fiber bundle path on the human readable image.

15. The magnetic resonance apparatus as set forth in claim 14, wherein the means for selecting includes:
   a manually controlled cursor displayed on the display means.

16. A magnetic resonance apparatus comprising:
   a means for acquiring a plurality of image representation without and with each of a plurality of diffusion weighting and directions;
   a display means for converting the image representations to a human readable image;
   a means for selecting one of a voxel d a group of voxel as a starting point that includes a manually controlled cursor displayed on the display means;
   a calculating means that interpolates the voxels giving them a higher resolution than acquired voxel and calculates a path of fluid diffusing along a fiber bundle that intersects the starting point; and the calculating means including;
   a diffusion direction processing means that:
      a) identifies a major Eigenvector of the starting point;
      b) identifies an adjacent voxel by following a direction of the major Eigenvector;
      c) finds a diffusion direction of the adjacent voxel by identifying a major Eigenvector of the adjacent voxel;
      d) marks the adjacent voxel;

e) repeats steps b), c), and d) until a termination criterion is met;

a means for overlaying the calculated fiber bundle path on the human readable image.

17. The magnetic resonance apparatus as set forth in claim 16, wherein the diffusion direction processing means iteratively performs steps b), c), and d) in a negative direction of the major eigenvector.

18. The magnetic resonance apparatus as set forth in claim 16, further including:

a termination criterion recognizing mean that recognizes at least one of:
   encountering a voxel with a major eigenvector not greater than a minor or medium eigenvector of the same voxel by a predetermined threshold;
   encountering a voxel with a major eigenvector direction different from a previous eigenvector direct on by greater than predetermined angle;
   exceeding a time threshold.

19. The magnetic resonance apparatus as set forth in claim 18, wherein the major, medium, and minor eigenvectors are mutually orthogonal vectors.

20. The magnetic resonance apparatus as set forth in claim 14, further including:

a means for calculating an apparent diffusion coefficient;

a means for calculating eigenvectors.

21. The magnetic resonance apparatus as set forth in claim 14, further including:

a means for calculating and displaying various anisotropy maps.

22. A method of displaying a diffusion pathway comprising:

gathering a diffusion weighted, multi-direction, three-dimensional magnetic resonance image representation of a region of a subject containing fibrous structures;

selecting a starting point within the image representation;

calculating eigenvectors for voxels in the image representation along a center line of a flow path which intersects a starting point;

forming from the magnetic resonance image representation a combined image representation and contrasted voxels along the center line of the flow path that intersects the selected starting point;

displaying the combined image representation in a human readable format.

23. A method of magnetic resonance comprising:

acquiring a plurality of image representations without and with each of a plurality of diffusion weighting and directions;

converting the image representations into a human readable image;

selecting one of a voxel and a group of voxels as a starting point;

interpolating the voxels giving them a higher resolution than the voxels of the acquired images;

calculating a path of fluid diffusing along a fiber bundle that intersects the starting point; and, overlaying the calculated fiber bundle path on the human readable image.

* * * * *